United States Patent [19]
Van Dine

[11] Patent Number: 4,705,698
[45] Date of Patent: Nov. 10, 1987

[54] ISOLATION OF SEMICONDUCTOR CONTACTS

[75] Inventor: John Van Dine, Westfield, N.J.

[73] Assignee: Chronar Corporation, Princeton, N.J.

[21] Appl. No.: 923,350

[22] Filed: Oct. 27, 1986

[51] Int. Cl.⁴ .................................................. B23K 9/00
[52] U.S. Cl. .................................... 427/53.1; 136/244; 219/121 LJ
[58] Field of Search ............... 427/53.1; 219/121 LG, 219/121 LJ, 121 LN

[56] References Cited

U.S. PATENT DOCUMENTS

| | | | |
|---|---|---|---|
| 4,037,315 | 7/1977 | Stapleton et al. | 427/380 |
| 4,179,310 | 12/1979 | Compton et al. | 427/53.1 |
| 4,181,563 | 1/1980 | Miyaka et al. | 427/53.1 |
| 4,288,776 | 9/1981 | Holmes | 427/53.1 |
| 4,399,345 | 8/1983 | Lapham et al. | 219/121 LJ |
| 4,443,685 | 4/1984 | Seman | 219/121 LJ |
| 4,456,490 | 6/1984 | Dutta et al. | 427/53.1 |
| 4,667,058 | 5/1987 | Catalano et al. | 219/121 LJ |

*Primary Examiner*—John H. Newsome
*Attorney, Agent, or Firm*—George E. Kersey

[57] ABSTRACT

In a method of isolating segments of contacts on a substrate by laser scribing, a laser is directed on portions to be removed through the substrate.

16 Claims, 4 Drawing Figures

ISOLATION OF SEMICONDUCTOR CONTACTS

This invention relates to contacts for structures such as semiconductors, and more particularly, to the formation of such contacts in isolation from one another.

In semiconductor devices it is necessary to have contacts which are isolated from one another in order to make the device operative. For example, in the case of solor cells it is common practice for a number of the cells to be connected in series on the same substrate, typically a glass panel, through contacts which are isolated from one another.

In the case of solar cells, the structure mounted on a glass or transparent substrate includes, for each cell, a front contact of tin oxide, a rear contact of metal, such as aluminum, and an intervening semiconductor layer, typically of amorphous silicon. The tin oxide front contacts are applied to the glass substrate in isolation, followed by deposition of the semiconductor. The final step is to apply the rear contacts. These typically are deposited as a metallic film with the desired isolation achieved by a wire mask. As a result, the discrete areas between the wires of the mask have a desired separation. Alternatively chemical etching can be used to achieve the desired isolation.

The use of wire masks and chemical etches are time consuming and do not always produce the desired separation of the back contacts, particularly in the case of the wire mask. In the case of chemical etching there is not only the expense of etching but also the need for a multi-step process. Also required is the complete removal of the etchant. If traces of the etchant are left behind, this adversely affects the performance of the final panel.

Attempts also have been made to separate the back contacts using a laser. This has proved unsatisfactory because the laser energy, while being sufficient to cause the desired separation of adjoining contacts, is insufficiently selective to avoid damage to underlying layers. In particular, in typical cases where lasers have been used in attempts to separate the back contacts, the lasers penetrate into the underlying semiconductor. In many cases this causes a shorting effect by metal which falls into semiconductor voids created by the lasers.

As a result, it has been generally concluded that it has not been possible to achieve the desired separation of the contacts using laser techniques because of the danger of shorting back and front contacts.

Accordingly, it is an object of the invention to facilitate the formation of isolated cells and the separation of contacts on bodies of semiconductors. A related object is to achieve isolation for the contacts of large area solar cells.

Another object of the invention is to overcome the difficulties in the prior art that have been experienced using wire masks. A related object is to overcome the shorting effects that are often encountered in wire masking. Still another related object is to eliminate the need for mask removal in order to complete the desired panel.

A further object of the invention is to overcome the prior art disadvantages associated with chemical etching. A related object is to overcome shorting effects associated with etching. Still another object is to overcome the need to remove all traces of etchant and avoid the disadvantages associated with residual etchant.

Still another object is to overcome the disadvantages associated with conventional laser separation of contacts. A related object is to avoid having metal fall into semiconductor voids created by the impingement of laser energy on the semiconductor.

SUMMARY OF THE INVENTION

In accomplishing the foregoing and related objects the invention provides a contact isolation by directing laser energy through the substrate, instead of by direct impingement of the contact layer being separated.

In addition, the laser frequency is selected to be highly absorbent by the semiconductor, which is, for example, amorphous silicon. By positioning the laser behind the substrate, material is removed by the laser in the direction of incident beam energy (as opposed to any scattered energy). This avoids the prior problem of shorting created by an implosion effect where material is drawn into the void created in the semiconductor.

The exact mechanism for the removal of material by the invention is not completely understood, but may result from vaporization of hydrogen included in the semiconductor, or from metallic melt vaporization. In any case, material is expelled outwardly from the semiconductor voids that are created, thus producing a satisfactory isolation of the contacts positioned on the semiconductor.

In accordance with one aspect of the invention, once initial isolation is achieved by expelling semiconductor material and associated metal, it is desirable to encapsulate the void to prevent any physical force, or other effect, from permitting metal to fall into the void that has been created. A suitable encapsulation involves an insulating material which can be applied in any conventional fashion. The only requirement on the insulating material is that it be capable of flowing into the void created by the laser energy.

DESCRIPTION OF THE DRAWINGS

Other aspects of the invention will become apparent after considering several illustrative embodiments taken in conjunction with the drawings in which.

DETAILED DESCRIPTION

Figure 1:
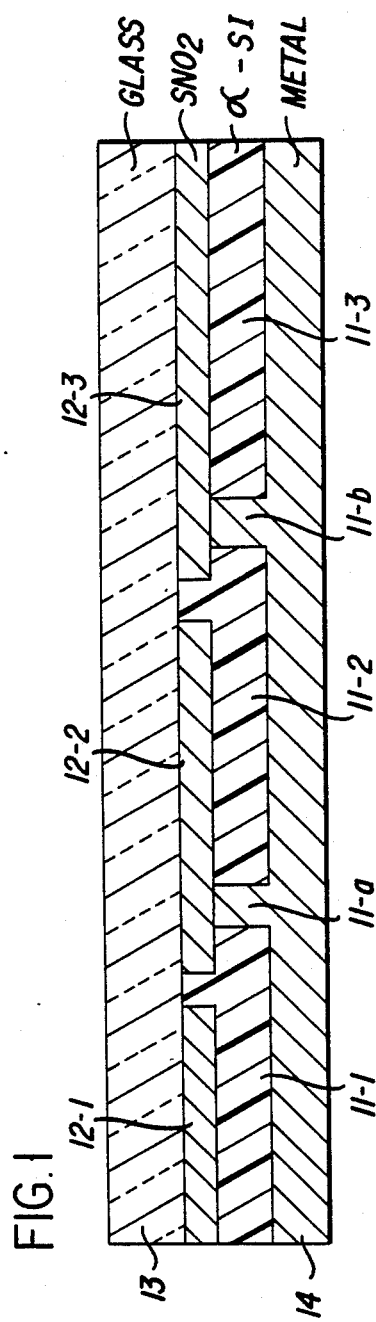
FIG. 1 is a cross sectional view of a solar cell panel before isolation of metallic cell contacts from one another.

With reference to the drawings, FIG. 1 shows a solar cell panel 10 in cross section, before the contacts of the various cells 11-1 through 11-3 have been isolated from one another.

In the formation of the solar panel 10 of FIG. 1, a patterned layer of transparent tin oxide 12 is applied to a glass substrate 13. In the particular structure 10 of FIG. 1, the tin oxide layer is divided into three discrete sections 12-1, 12-2, and 12-3. Consequently, structure 10 can accommodate three separate solar cells. The first cell associated with the tin oxide layer 12-1 is formed by an amorphous silicon segment 11-1. Similarly, the second tin oxide layer 12-2 has associated with it a second segment of amorphous silicon 11-2, while the third tin oxide layer 12-1 has an associated segment 11-3 of amorphous silicon.

To complete the structure 10 of FIG. 1, a metallic layer 14, for example of aluminum, is superimposed upon the discrete amorphous silicon segments 11-1 through 11-3. The metallic layer 14 extends over the entire structure and in particular into the gap 11-a between the first and second amorphous silicon segments 11-1 and 11-2. Similarly the metallic layer 14 extends into the gap 11-b between the second and third amorphous silicon segments 11-2 and 11-3.

With the metallic layer extending into the gaps 11-a and 11-b, the structure 10 is not usable as a solar panel because the amorphous silicon segments 11-1 through 11-3 are short-circuited.

In order to eliminate the short-circuit of FIG. 1 in accordance with the invention, a laser 15 is positioned behind the glass substrate 13. The laser 15 is then operated at a frequency where the laser energy is highly absorbed by the amorphous silicon segments 11-2 and 11-3, and transmitted by both the glass substrate and the tin oxide layer.

Initially the laser 15 is behind the amorphous silicon segment 11-2. Since this segment is highly absorbent of laser energy, the amorphous silicon in this region of the laaser beam 15-b is expelled. The exact mechanism of expulsion is not certain. It is speculated that there may be vaporization of the amorphous silicon because of contained hydrogen. There may also be metallic melt vaporization. In any event the effect of the laser beam is to expell amorphous silicon and the overlying metal in a gap 14-a.

Once the first gap 14-a is created, the first solar cell 11-1 is isolated from the second solar cell. The reason is that the first portion of the metallic layer 14-1 forms a back contact for the first region 11-1 of amorphous silicon. The front contact is formed by the first tin oxide segment 12-1. The metallic material that extends into the gap 11-a forms a series connection with the second segment of tin oxide. The region 11-2$^{11}$ is made as narrow as possible in order to have the maximum amount of amorphous silicon as the active element of the individual solar cell.

Once the desired separation is effected between the first solar cell 11-1 and a second solar cell with an active element 11-2$^1$, the laser 15 is moved to isolate the second active element 11-2$^1$ and a third active element 13-3$^1$. It will be apparent that instead of moving the laser 15, two separate lasers can be used.

It is to be noted that the laser 15 is operated substantially at a frequency where amorphous silicon, or the material of the active element, absorbs laser energy. A YAG (Yttrium aluminum Garnet) laser operating with a frequency doubler results in a wave length of 532 nanometers. This is in the "green region" where amorphous silicon absorbs approximately peak energy. The YAG laser, without the frequency doubler, operates at a wave length of 1064 nanometers.

As an alternative, an Argon laser with a frequency of about 630 nanometers can be employed to avoid the need for a doubler. The wave length of 630 nanometers is sufficiently close to the maximum absorption frequency for amorphous silicon. In fact, amorphous silicon absorbs laser energy in the range from about 400 to about 650 nanometers.

In addition, the laser energy profile is shaped to be as rectangular as possible, and the pulse width is shorter than 100 nanoseconds and desirably below 50 nanoseconds.

Figure 3B:
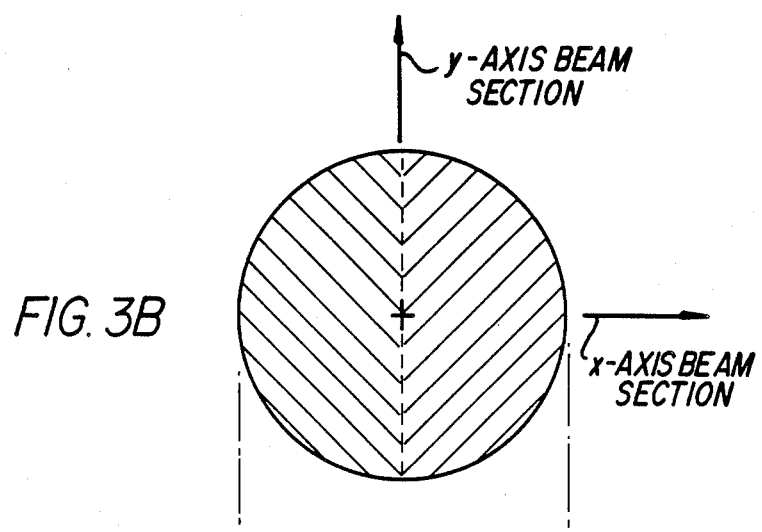
FIG. 3B is a cross section of the laser beam of FIG. 3A.
Figure 3A:
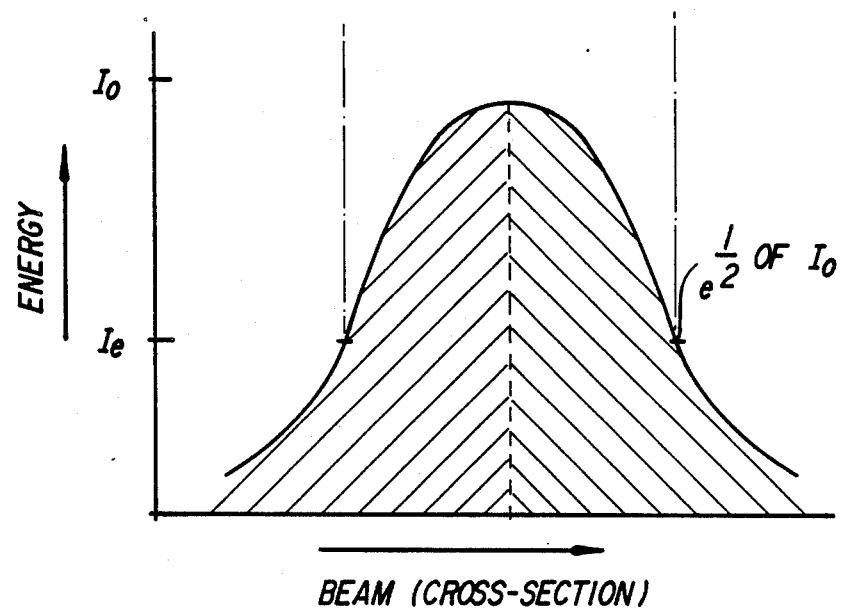
FIG. 3A is a diagram of an illustrated laser beam energy in accordance with the invention.

The effect of the laser beam is illustrated in FIG. 3A. The effective beam diameter is the interval between $1/e^2$ of maximum energy Io. A cross section of the beam is shown in FIG. 3B.

Figure 2:
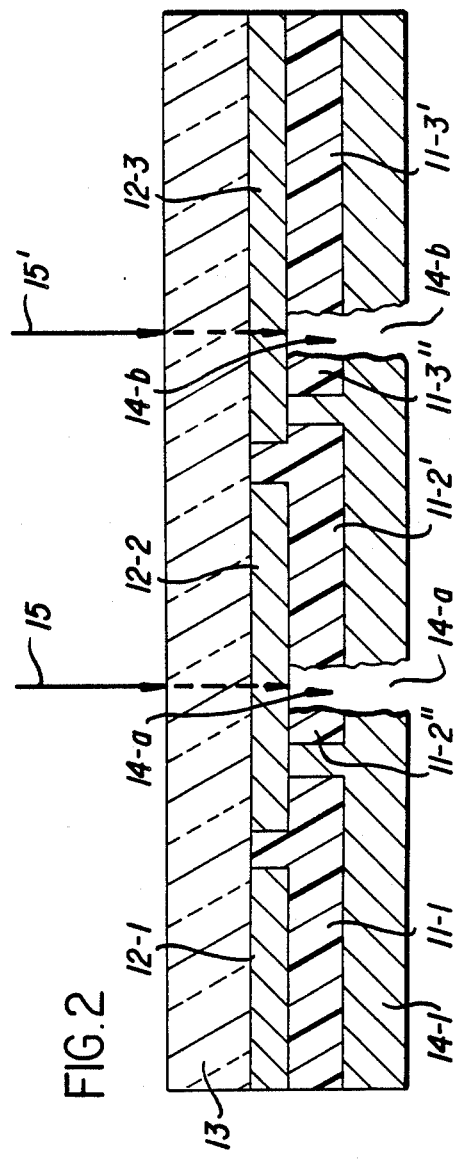
FIG. 2 is a cross sectional view of a modified FIG. 1 showing the isolation of solar cell contacts in accordance with the invention.

The beam is shaped in the manner illustrated in FIG. 3A in order to provide beam shaping that controls the extent to which there could be melt energy and metallic vaporization that could fill the openings 14-a and 14-b of FIG. 2.

Once the removal of material in the openings 14-a and 14-b is completed, the metallic contacts 14-a through 14-3 are coated with a suitable insulator to fill the openings 14-a and 14-b. This prevents metallic material from shorting any of the individual cells 11-1, 11-2$^1$ and 11-3$^1$.

Other aspects of the invention will be apparent to those of ordinary skill in the art.

What is claimed is:

1. The method of isolating segments from one another which comprises the steps of:
   (a) forming a layer on a substrate; and
   (b) directing a beam of energy through the substrate to expell disticintive portions of said layer.

2. The method of claim 1 wherein the substrate includes a patterned set of active elements between said layer and said substrate.

3. The method of claim 2 wherein a patterned set of conductive elements is included between said substrate and said patterned active elements.

4. The method of claim 2 wherein said active elements are of amorphous silicon.

5. The method of claim 3 wherein the patterned conductive elements are of tin oxide.

6. The method of claim 1 wherein said beam of energy is of laser origin.

7. The method of claim 6 wherein said laser energy has a wave length approximately equal to the absorption wave length of said layer.

8. The method of claim 7 wherein said laser energy has a wave length corresponding substantially to the absorption wavelength of amorphous silicon.

9. The method of claim 8 wherein said amorphous silicon has an absorption wavelength in the range extending from about 400 to about 650 nanometers.

10. The method of claim 9 wherein said laser beam has a pulse width in the range below about 100 nanoseconds.

11. The method of claim 10 wherein said pulse width is below about 50 nanoseconds.

12. The method of claim 2 wherein said active elements contain hydrogen which is evolved by said beam of energy.

13. The method of claim 12 wherein said beam of energy is moved to a series of discrete positions with respect to said substrate in order to provide a discrete series of separations between active elements.

14. The method of claim 2 wherein said beam of energy produces melt vaporization.

15. The method of claim 1 further including the step of applying an insulator to fill voids left by expulsion of distinctive portions of said layer.

16. The method of claim 2 wherein said beam of energy expells distinctive portions of said layer and underlying distinctive portions of said active elements.

* * * * *